LEAD CONNECTIONS IN PRINTED CIRCUITS

Filed Oct. 23, 1965

Inventor:
William D. Richards,
by Albert [signature]
Attorney 3,391,375
LEAD CONNECTIONS IN PRINTED CIRCUITS
William D. Richards, 167 Holliston St., Medway, Mass. 02053
Filed Oct. 23, 1965, Ser. No. 503,839
4 Claims. (Cl. 339—17)

ABSTRACT OF THE DISCLOSURE

Coupling member for connecting a lead end to a printed circuit having a portion encircling one end of a hole through the board, the member being tapered and of stock that is a good conductor of electricity with a lengthwise channel freely receiving the lead end with margins collapsing as the member is driven into a hole.

Figure 1:
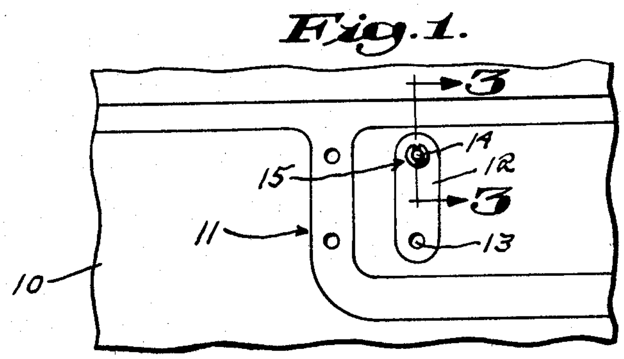

The present invention relates to coupling members for use in connecting lead ends to printed circuits of the type having leads encircling holes in the board on which the circuits are printed and to combinations of such lead ends, printed circuits, and members.

Printed circuits are, of course, widely used. In spite of their wide acceptance, they present a troublesome problem for, in practice, each printed circuit lead encircles a hole through the board, either as a circle on the board or as a lining extending through the hole. The leads to be attached are inserted into the appropriate holes and are soldered in place. Should the component connected to the printed circuit by the thus attached leads fail to function properly, such failure may be due to the joints or it may be a case of a defective component so that it is necessary to unsolder the joints to detach the component. The unsoldering of such joints is time-consuming and difficult because if two leads must be unsoldered, the solder often cools to re-connect an unsoldered joint while heat is being applied to the other.

The principal objective of the present invention is to overcome this difficulty by providing connections that are both easily and positively effected and readily released, if necessary, even if soldered.

In accordance with the invention, this objective is attained by utilizing coupling members each tapered and having a passage dimensioned to freely receive a lead end, and of deformable stock, typically brass, that is a good conductor of electricity. The outside dimensions of each member, at its small end, are less than the diameter of the hole into which it is to be inserted, while at its large end, its cross sectional movements are substantially greater than the hole diameter. Such a member, with a lead end in its passage may be inserted into a hole and, when driven in place, it is deformed to lock the lead end thereto and deforms against the upper end of the hole with the member being anchored in tight mechanical contact with the encircling lead in a substantially annular zone.

The member preferably is flanged at its upper end and of such length that its small end protrudes through the board when it is anchored in a hole.

If desired, each member may be soldered to the appropriate circuit lead, although unnecessary to ensure a good connection. If unsoldering becomes necessary, it is only necessary to start the member out of its hole to prevent the melted solder again anchoring it when cooled.

In the accompanying drawings, there are shown illustrative embodiments of the invention from which these and other of its objectives, novel features, and advantages will be readily apparent.

Figure 2:
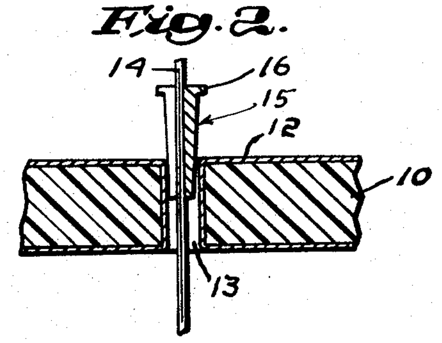
Figure 3:
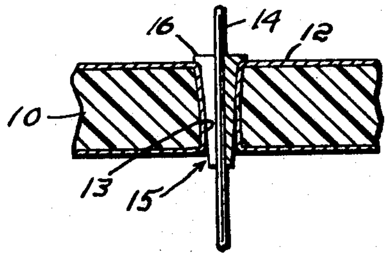
Figure 4:
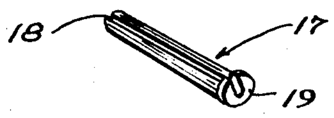
Figure 5:
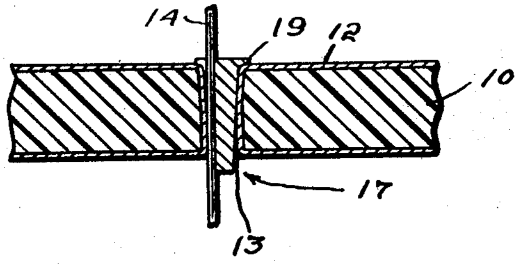

In the drawings:

FIGURE 1 is a fragmentary plan view of a printed circuit,

FIGURE 2 is a fragmentary view, on an increased scale, illustrating the entry of a connecting member into a circuit board hole, FIGURE 3 is a like view but showing the connecting member seated, FIGURE 4 is a perspective view illustrating a connecting member in accordance with another embodiment of the invention, and FIGURE 5 is a view similar to FIGURE 3, but showing the connecting member of FIGURE 4 in its seated position.

As illustrative of a conventional printed circuit, there is shown a part of a board 10 having a generally indicated circuit 11 printed on one surface thereof, the circuit including leads such as the lead 12 encircling a hole 13 through the board 10 to receive a lead end 14 of a component not shown to be connected to the circuit 11. The lead 12 may or may not extend through the hole 13 as a lining therefor.

In the embodiment of the invention illustrated by FIGURES 1–3, a tapered connecting member is generally indicated at 15 and is in the form of a split sleeve of deformable stock that is a good conductor of electricity, typically brass. The member 15 is dimensioned so that the diameter of its small end is substantially less than that of the hole 13 while the diameter of its large end, shown as including a flange 16, is substantially greater.

The member 15 may be set in a hole 13 and a lead 14 inserted therein, preferably extending entering through the member 15. The member 15 is then forced into a seated position wherein it has deformed against the lead 14 and against the hole-encircling portion of the lead 12 and deforming against the upper part of the hole 13 ensuring a tight secure joint between the member 15 and the board 10 and the lead 12. The board 10 is a dielectric and usually is soft enough so that the upper part of each hole 13 is somewhat deformed when a member 15 is seated therein. The joint may be conventionally soldered if desired.

In the embodiment of the invention illustrated by FIGURES 4 and 5, the connecting member is indicated at 17 and, like the member 15, it is tapered and formed of stock that is readily deformed and is a good conductor of electricity. The member 17 is similarly dimensioned relative to the holes 13 of the board 10 but has its passage for a lead 14 in the form of a lengthwise channel 18 dimensioned freely to the lead 14A. The member 17 is also provided with a flange 19 at its large end. The member 17 is used and functions in the same way as the member 15.

The members 15 and 17 are both shown as of such length relative to the thickness of the board 10 that when either is securely seated in a hole 13 thereof, from the side on which the circuits are printed, its small end protrudes from the other side of the board 10. This enables a seated connecting member to be readily unseated even if the joint is soldered.

It will thus be appreciated that connecting members in accordance with the invention are well adapted to meet the requirements for a secure and positive joint between printed circuit and component leads that may also be quickly and easily released.

I claim:

1. A coupling member for connecting a lead end to a printed circuit lead of the type having a portion marginally encircling one end of a hole through the board thereof, said member being tapered and having a lengthwise passage channel along one edge and dimensioned to freely receive said lead end and establishing marginal portions and a wedge shaped backing portion, the minimum outside dimensions of the member being less than the diameter of said hole and its maximum outside diameter being greater than said diameter, said member being of stock that is a good conductor of electricity and sufficiently deformable so that when the member is entered and forced into the hole from its encircled end, the marginal portions collapse to grip the lead end tightly and deform to bring the member in tight mechanical contact with the encircling lead in a substantially annular zone.

2. The coupling member of claim 1 in which the member is a split sleeve and the lead is confined within the member when the member is forced into a hole.

3. The coupling member of claim 1 in which the lead is wedged against the wall of the hole when the member is forced into that hole.

4. The coupling member of claim 1 in which the length of the wedge shaped backing portion is greater than the thickness of the board.

References Cited

UNITED STATES PATENTS

| | | | |
|---|---|---|---|
| 2,677,118 | 4/1954 | Stone | 339—273 XR |
| 2,937,358 | 5/1960 | Bulger | 339—17 |
| 2,959,766 | 11/1960 | Jacobsen | 339—273 |
| 3,076,164 | 1/1963 | Ullman et al. | 339—17 |
| 3,133,774 | 5/1964 | Bulk et al. | 339—17 |

FOREIGN PATENTS

| | | | |
|---|---|---|---|
| 547,552 | 9/1922 | France. | |

MARVIN A. CHAMPION, *Primary Examiner.*

P. A. CLIFFORD, *Assistant Examiner.*